(12) United States Patent
Kerman (10) Patent No.: US 10,735,003 B2
(45) Date of Patent: Aug. 4, 2020

(54) JOSEPHSON PHASE-SLIP QUBITS

(71) Applicant: Massachusetts Institute of Technology, Cambridge, MA (US)

(72) Inventor: Andrew J. Kerman, Arlington, MA (US)

(73) Assignee: Mssachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/580,215

(22) Filed: Sep. 24, 2019

(65) Prior Publication Data
US 2020/0106445 A1 Apr. 2, 2020

Related U.S. Application Data (60) Provisional application No. 62/737,372, filed on Sep. 27, 2018.

(51) Int. Cl.
*H03K 19/195* (2006.01)
*G06N 10/00* (2019.01)

(52) U.S. Cl.
CPC ......... *H03K 19/1952* (2013.01); *G06N 10/00* (2019.01)

(58) Field of Classification Search
CPC .................. H03K 19/1952; G06N 10/00
See application file for complete search history.

(56) References Cited

U.S. PATENT DOCUMENTS

| | | | |
|---|---|---|---|
| 10,331,163 B1* | 6/2019 | Luo | H03K 3/38 |
| 2016/0164505 A1* | 6/2016 | Naaman | H03K 3/38 |
| | | | 327/528 |
| 2017/0140296 A1 | 5/2017 | Kerman | |
| 2017/0141286 A1 | 5/2017 | Kerman | |

OTHER PUBLICATIONS

Babbush, et al., "Adiabatic Quantum Simulation of Quantum Chemistry;" Scientific Reports, vol. 4; Oct. 13, 2014; 11 Pages.
Bell, et al., "Spectroscopic Evidence of the Aharonov-Casher Effect in a Cooper Pair Box;" Physical Review Letters; Mar. 10, 2016; 5 Pages.
Biamonte, et al., "Quantum Machine Learning;" Nature, vol. 549; Sep. 14, 2017; 8 Pages.

(Continued)

*Primary Examiner* — Daniel D Chang
(74) *Attorney, Agent, or Firm* — Daly, Crowley, Mofford & Durkee LLP (57) ABSTRACT

A qubit includes a superconducting loop interrupted by a plurality of magnetic flux tunneling elements, such as DC SQUIDs, leaving superconducting islands between the elements. An effective transverse magnetic moment is formed by magnetically tuning each element to yield a large tunneling amplitude. The electrical polarization charge on an island is tuned to produce destructive interference between the tunneling amplitudes using the Aharonov-Casher effect, resulting in an effectively zero transverse field. Biasing the charge away from this tuning allows tunneling to resume with a large amplitude. Interrupting the island with a third tunneling path, such as a Josephson junction, permits independently tuning and biasing the two islands that result, enabling effective control of two independent (X and Y) transverse fields.

22 Claims, 11 Drawing Sheets

(56) References Cited

OTHER PUBLICATIONS

Chuang, et al., "Quantum Computers, Factoring, and Decoherence;" Science, vol. 270; Dec. 8, 1995; 4 Pages.
Cross, et al., "A Comparative Code Study for Quantum Fault Tolerance;" Quantum Information and Computation, vol. 9; Mar. 8, 2009; 32 Pages.
Das, et al., "Colloquium: Quantum Annealing and Analog Quantum Computation;" Reviews of Modern Physics, vol. 80; Sep. 5, 2008; 21 Pages.
DiVincenzo, et al., "Fault-Tolerant Error Correction with Efficient Quantum Codes;" Physical Review Letters, vol. 77, No. 15; Oct. 7, 1996; 4 Pages.
Duncan, et al., "Nobel Lecture: Topological Quantum Matter;" Reviews of Modern Physics, vol. 89; Oct. 9, 2017; 10 Pages.
Friedman, et al., "Aharonov-Casher-Effect Suppression of Macroscopic Tunneling of Magnetic Flux;" Physical Review Letters, vol. 88, No. 5; Feb. 4, 2002; 4 Pages.
Georgescu, et al., "Quantum Simulation;" Reviews of Modern Physics, vol. 86; Mar. 10, 2014; 33 Pages.
Hen, et al., "Driver Hamiltonians for Constrained Optimization in Quantum Annealing;" Physical Review A, vol. 93; Jun. 13, 2016; 8 Pages.
Jiang, et al., "Non-Commuting Two-Local Hamiltonians for Quantum Error Suppression;" Quantum Information Processing, vol. 16; Feb. 18, 2017; 24 Pages.
Kosterlitz, "Nobel Lecture: Topological Defects and Phase Transitions;" Reviews of Modern Physics, vol. 89; Oct. 9, 2017; 7 Pages.
Lloyd, et al., "Adiabatic and Hamiltonian Computing on a 2D Lattice with Simple Two-Qubit Interactions;" New Journal of Physics; Feb. 12, 2016; 17 Pages.
Marvian, et al., "Error Suppression for Hamiltonian Quantum Computing in Markovian Environments;" Physical Review A, vol. 95; Mar. 3, 2017; 6 Pages.
Nagaj, et al., "Hamiltonian Quantum Cellular Automata in One Dimension;" Physical Review A, vol. 78; Sep. 9, 2008; 14 Pages.
Nisoli, et al., "Colloquium: artificial Spin Ice: Designing and Imaging Magnetic Frustration;" Reviews of Modern Physics, vol. 85; Oct. 2, 2013; 18 Pages.
Olivares, et al., "Quantum Simulation with a Boson Sampling Circuit;" Physical Review A, vol. 94; Aug. 17, 2016; 8 Pages.
O'Malley, et al., "Scalable Quantum Simulation of Molecular Energies;" Physical Review X, vol. 6; Jul. 18, 2016; 13 Pages.
Peropadre, et al., "Equivalence Between Spin Hamiltonians and Boson Sampling;" Physical Review A, vol. 95; Mar. 24, 2017; 8 Pages.
Pop, et al., "Experimental Demonstration of Aharonov-Casher Interference in a Josephson Junction Circuit;" Physical Review B, vol. 85; Mar. 5, 2012; 9 Pages.
Seeley, et al., "The Bravyi-Kitaev Transformation for Quantum Computation of Electronic Structure;" The Journal of Chemical Physics, vol. 137; Dec. 12, 2002; 17 Pages.
Terhal, "Quantum Error Correction for Quantum Memories;" Reviews of Modern Physics, vol. 87; Apr. 7, 2015; 40 Pages.
Wei, "Hamiltonian Quantum Computer in One Dimension;" Physical Review A, vol. 92; Dec. 21, 2015; 12 Pages.
Yan, et al., "The Flux Qubit Revisited to Enhance Coherence and Reproducibility;" Nature Communications, vol. 7; Nov. 3, 2016; 9 Pages.
Zanardi, et al., "Holonomic Quantum Computation;" Physics Letters A, vol. 264, Issues 2-3; Dec. 20, 1999; 6 Pages.
Zhou, et al., "Quantum Spin Liquid States;" Reviews of Modern Physics, vol. 89; Apr. 18, 2017; 50 Pages.
PCT International Search Report and Written Opinion dated Dec. 6, 2019 for International Application No. PCT/US2019/052616; 14 Pages.
Belkin, et al., "Formation of Quantum Phase Slip Pairs in Superconducting Nanowires;" Downloaded from https://arxiv.org/abs/1406.5128; May 27, 2015; 20 Pages.

\* cited by examiner

JOSEPHSON PHASE-SLIP QUBITS

CROSS-REFERENCE TO RELATED APPLICATION

This application claims the benefit of U.S. Provisional Application 62/737,372, filed Sep. 27, 2018, the entire contents of which are incorporated herein by reference.

GOVERNMENT RIGHTS

This invention was made with Government support under Grant No. FA8702-15-D-0001 awarded by the U.S. Air Force. The Government has certain rights in this invention.

BACKGROUND

Quantum spin-$\frac{1}{2}$ models serve as basic paradigms for a wide variety of physical systems in quantum statistical mechanics and many-body physics, and complex quantum spin-$\frac{1}{2}$ models are among the most studied from the perspective of quantum phase transitions and topological order. See Vi Zhou, Kazushi Kanoda, and Tai-Kai Ng, "Quantum spin liquid states," Rev. Mod. Phys. 89, 025003 (2017); John Michael Kosterlitz, "Nobel lecture: Topological defects and phase transitions," Rev. Mod. Phys. 89, 040501 (2017); F. Duncan M. Haldane, "Nobel lecture: Topological quantum matter," Rev. Mod. Phys. 89, 040502 (2017); Cristiano Nisoli, Roderich Moessner, and Peter Schiffer, "Colloquium: Artificial spin ice: Designing and imaging magnetic frustration" Rev. Mod. Phys. 85, 1473-1490 (2013).

In addition, since the spin-$\frac{1}{2}$ particle in a magnetic field is one of the simplest realizations of a qubit, many quantum information processing paradigms draw heavily on concepts which originated from, or are related to, quantum magnetism. For example, the formalism underlying quantum fault-tolerance in gate-model quantum computing is built on viewing decoherence in a Pauli basis, and indeed in most cases physically engineering measurements to project errors onto this basis. See, for example: I. L. Chuang, R. Laflamme, P. W. Shor and W. H. Zurek, Quantum computers, factoring and decoherence, Science, 270, pp. 1635-1637 (1995); D. P. DiVincenzo and P. W. Shor, Fault tolerant error correction with efficient quantum codes, Phys. Rev. Lett. 77, pp. 3260-3263 (1996); Barbara M. Terhal, "Quantum error correction for quantum memories," Rev. Mod. Phys. 87, 307{346 (2015), and reference therein; see also Andrew W. Cross, David P. Divincenzo, and Barbara M. Terhal, "A comparative code study for quantum fault tolerance," Quantum Info. Comput. 9, 541-572 (2009).

In fact, nearly all constructions underlying quantum computational and error-mitigation protocols in quantum information processing are viewed in the language of effective quantum spin models, including those used in quantum annealing, Hamiltonian, and holonomic computing, quantum simulation, and boson sampling. Arnab Das and Bikas K. Chakrabarti, "Colloquium: Quantum annealing and analog quantum computation," Rev. Mod. Phys. 80, 1061-1081 (2008); Zhang Jiang and Eleanor G. Rieffel, "Non-commuting two-local Hamiltonians for quantum error suppression," Quantum Information Processing 16, 89 (2017); Seth Lloyd and Barbara M Terhal, "Adiabatic and Hamiltonian computing on a 2d lattice with simple two-qubit interactions," New Journal of Physics 18, 023042 (2016); Daniel Nagaj and Pawel Wocjan, "Hamiltonian quantum cellular automata in one dimension," Phys. Rev. A 78, 032311 (2008); Tzu-Chieh Wei and John C. Liang, "Hamiltonian quantum computer in one dimension," Phys. Rev. A 92, 062334 (2015); Milad Marvian and Daniel A. Lidar, "Error suppression for Hamiltonian quantum computing in Markovian environments," Phys. Rev. A 95, 032302 (2017); Paolo Zanardi and Mario Rasetti, "Holonomic quantum computation," Physics Letters A 264, 94 (1999); Jacob T. Seeley, Martin J. Richard, and Peter J. Love, "The Bravyi-Kitaev transformation for quantum computation of electronic structure," Journal of Chemical Physics 137, 224109 (2012); I. M. Georgescu, S. Ashhab, and Franco Nori, "Quantum simulation," Rev. Mod. Phys. 86, 153{185 (2014); P. J. J. O'Malley, et al., "Scalable quantum simulation of molecular energies," Phys. Rev. X 6, 031007 (2016); Diego Gonzalez Olivares, Borja Peropadre, Alan Aspuru-Guzik, and Juan Jose Garda-Ripoll, "Quantum simulation with a boson sampling circuit," Phys. Rev. A 94, 022319 (2016); and Borja Peropadre, Alan Aspuru-Guzik, and Juan Jose Garda-Ripoll, "Equivalence between spin Hamiltonians and boson sampling," Phys. Rev. A 95, 032327 (2017).

It is notable, then, that no physical qubit system implemented to date can realize strong, engineerable, static, vector spin-$\frac{1}{2}$ interactions. Instead, existing techniques rely on pulsed implementation of effective Hamiltonians. For example, in the context of digital quantum simulation, discrete, sequential, non-commuting gate operations can be used to simulate evolution under complex spin Hamiltonians (using the Suzuki-Trotter expansion), where the error relative to the static Hamiltonian being simulated can be reduced by shortening the individual discrete pulses (relative to the energies being simulated). The circuits devised to implement quantum fault-tolerance operate in a similar manner (with the addition of projective measurement), effectively simulating damping into a desired set of logical code states which are themselves built out of physical spin-$\frac{1}{2}$-like states of the constituent physical qubits.

Although these pulsed methods are powerful and flexible, they tend to encounter problems when the spin models require very strong and/or complex interactions. Time-domain, Trotterized implementation of complex spin Hamiltonians places very strong restrictions on the effective energy scales of the Hamiltonian being simulated, which can become a major roadblock. The number of gate operations required to approximate each time step of the full Hamiltonian grows quickly as the complexity of the interactions grows, causing the overall simulated energy scale to decrease. Since in real implementations there will always be a hard, practical upper limit to the frequencies of pulsed gates that can be applied without exciting additional spurious degrees of freedom, this results in an effective dynamic range that will be reduced as the complexity and/or the size of the Hamiltonian increase. In addition, gate-based implementation necessarily implies that the physical system occupies Hilbert space far above the ground state of the physical qubits undergoing the operations, resulting in a sensitivity to dissipative decoherence processes which tend to take the system irreversibly out of the encoded solution space (this is the motivation for quantum error correction). By comparison, a static Hamiltonian implementation has an intrinsic "protection" from noise associated with being in or near the ground state, both against logical fluctuations within the encoded solution space and against transitions out of this space. For these reasons, a qubit implementation capable of supporting strong, static, vector spin interactions could be instrumental for several applications. However, no such implementation has yet been found.

Superconducting circuits are already among the most engineerable high-coherence quantum systems available, allowing a range of behavior and interactions to be constructed by design. This is perhaps best exemplified using flux qubits to emulate quantum spin models for quantum annealing applications. Programmable quantum transverse-field Ising models with more than 2000 physical spins have been realized by D-Wave Systems, Inc. of Burnaby, Canada. However, there are fundamental limitations of flux qubits which prevent them from being used to realize strong, fully-programmable vector spin interactions.

Figure 1A:
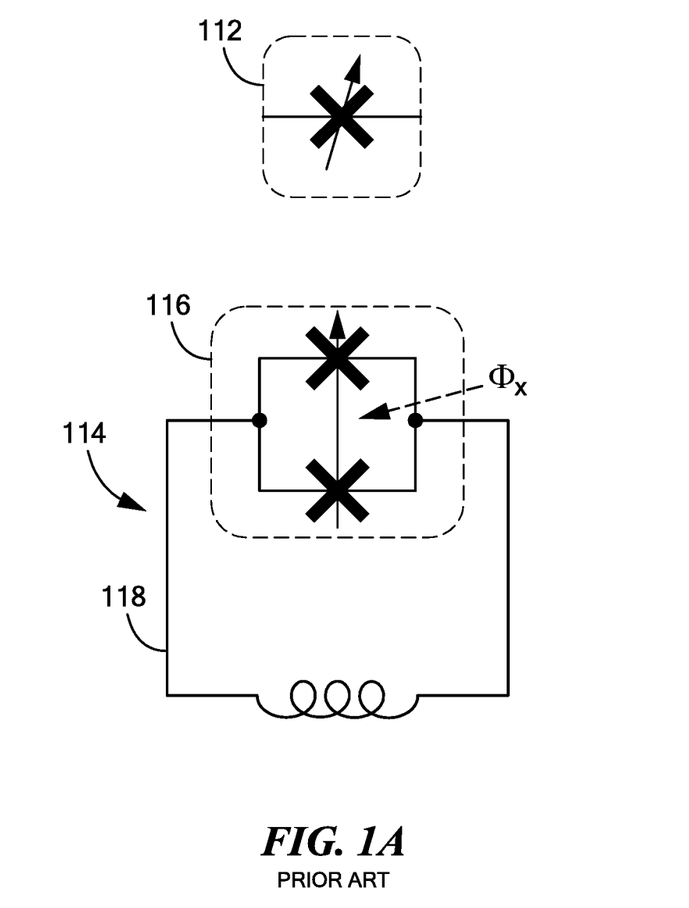
FIGS. 1A-1D show effective transverse field tuning of a conventional flux qubit.
Figure 1B:
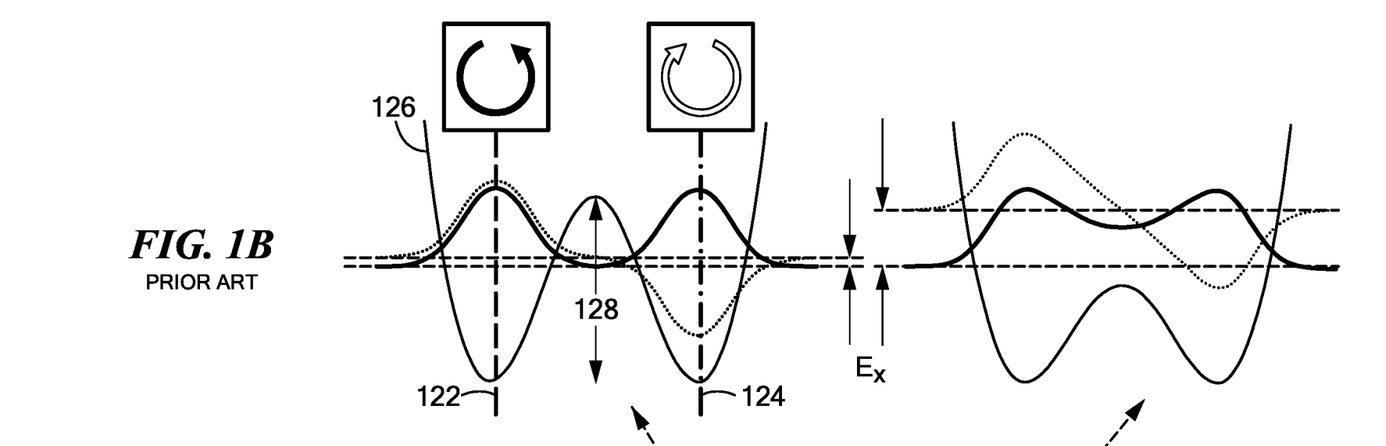

FIGS. 1A-1D illustrate the physics behind this. FIG. 1A schematically shows an effective, flux tunable Josephson junction 112 inside a flux qubit 114 realized using a DC SQUID 116. When the flux qubit loop 118 is biased with an external flux $\Phi_e = \Phi_0/2$ (where $\Phi_0 = h2e$ is the superconducting fluxoid quantum), the two lowest-energy semiclassical states of the loop 118 are nearly degenerate due to the Meissner effect, having approximately equal and opposite supercurrents flowing, corresponding to either expulsion of the external flux from the loop 118 or pulling additional flux into it, such that it contains exactly zero or one fluxoid quantum, respectively. These two semiclassical states are associated with two local minima 122 and 124 in an inductive potential 126 shown in FIG. 1B. This potential 126 is experienced by a fictitious particle, whose "position" corresponds to the fluxoid contained in the loop inductor. As shown in FIG. 1B, the two eigenstates of Z correspond to opposite persistent currents in the qubit loop, connected by a tunneling barrier 128 whose height is controlled by the flux through the DC SQUID 116, and they can be used to emulate the two eigenstates of Z for an effective spin-½ particle.

Figure 1C:
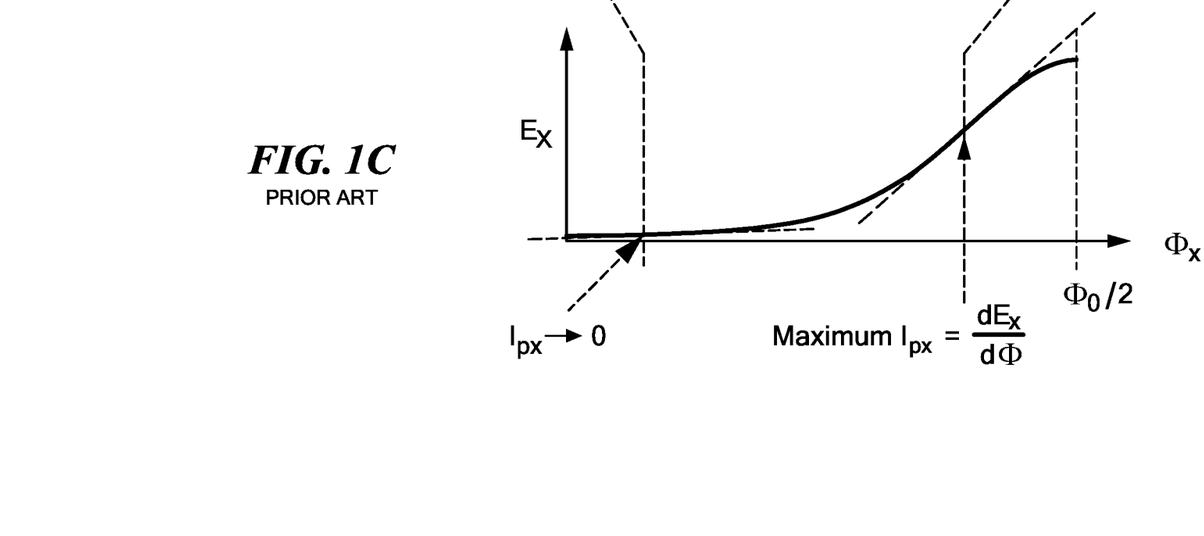
Figure 1D:
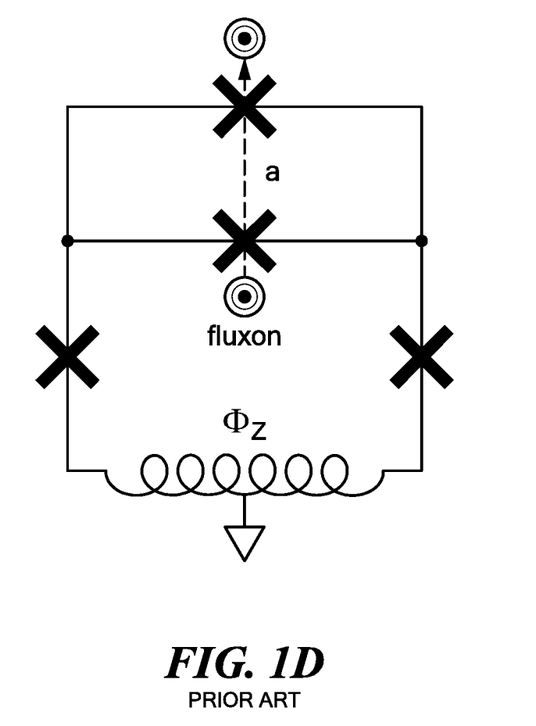

The total charge that has circulated around the loop 118 plays the role of the "momentum" of this particle, such that when these quantities are treated quantum-mechanically and become non-commuting quantum operators, the resulting quantum fluctuations produce tunneling through the central Josephson potential barrier, between the two potential wells. This tunneling plays the role of a Zeeman interaction between the emulated spin and an effective transverse field. This effective transverse field energy can then be tuned by applying a flux $\Phi_X$ to the DC SQUID 116 loop. The DC SQUID 116 has a total Josephson energy (when it is viewed as a single effective junction 112) that depends on this flux via the Aharonov-Bohm effect, which causes a phase shift between the two parallel Josephson tunneling paths (the two arms of the loop). At $\Phi_X=0$, the Josephson energy is maximal, and the tunneling is exponentially small. As $\Phi_X$ is increased, the two Josephson tunneling amplitudes increasingly cancel each other, lowering the potential barrier and increasing the tunneling exponentially, as shown in FIG. 1C. At $\Phi_X=\Phi_0/2$, the effective Josephson energy goes to zero and the tunneling is maximized. The effective transverse magnetic moment is given approximately by the derivative of this tunneling energy splitting with respect to flux, and as shown in FIG. 1C it goes exponentially to zero as the splitting goes to zero. FIG. 1D illustrates how this tunneling effect can be viewed as a "fluxon" moving out of (or into) the loop; that is, the tunneling is between two states differing by one flux quantum stored in the loop.

From the perspective of spin models, there are two major limitations of this prior art. First, the effective transverse magnetic moment is only large when the barrier height (and therefore the tunneling) is strongly sensitive to flux, which occurs only when the barrier is already low (and thus the tunneling is large) to begin with. In spin Hamiltonian language and shown in FIG. 1C, the transverse moment is only large when the transverse field is itself large. As the transverse field is reduced to zero, the transverse moment decreases exponentially to zero. The result is that the local transverse field terms in the Hamiltonian will be much larger than any implementable transverse interaction terms, a restriction which strongly undercuts the motivation for realizing complex spin models in the first place.

Second, this scheme provides no way to emulate moments corresponding to two independent transverse field directions (i.e. X and Y) in addition to the longitudinal (i.e. Z) moment. The reason for this is simple: the system only provides one accessible magnetic operator—current in the DC SQUID loop 116—to control the coupling between the two eigenstates of Z (spin up and spin down), which we can choose to label X. An effective Y moment would require a second such operator which does not commute with that representing X, since the Pauli X and Y operators are non-commuting. This is an important limitation since many of the quantum applications discussed earlier require both XX and YY interactions, among them holonomic computing, constrained quantum annealing, and most of the many-body spin models of interest (e.g., the Heisenberg model).

SUMMARY OF ILLUSTRATIVE EMBODIMENTS

Disclosed embodiments include a new class of superconducting circuits called Josephson phase-slip qubits ("JPSQs") that are designed specifically to emulate a spin with the desired vector properties not found in the prior art. To provide a large, effective transverse magnetic moment over the full range of transverse field values including around zero, a JPSQ includes not one, but two fluxon tunneling elements (e.g. DC SQUIDs) that can be controlled separately.

Because these elements interrupt the main qubit superconducting loop, they create an island between them. Electrically polarizing this island with a voltage, such that it has an excess charge equal to one half of a superconducting Cooper pair (i.e. a charge of one electron) causes a phase shift of π between the two fluxon tunneling paths due to the Aharonov-Casher effect, such that the two paths interfere destructively and cancel. This cancellation of tunneling emulates zero transverse field. About this point, the system is now linearly sensitive to any imbalance in the two tunneling amplitudes, allowing it to have a strong transverse magnetic moment even when the transverse field energy is zero.

In this configuration, the circuit effectively has a vector dipole moment with three independent components, corresponding to: (1) the usual persistent current around the loop; (2) the differential current between the two DC SQUID loops; and (3) the island voltage. These three physical quantities form a non-commuting set of quantum operators which, in the computational basis, emulate the desired Pauli spin operators.

A slightly more complex variant includes three (or more) fluxon tunneling paths, allowing all three components of the vector dipole to be emulated magnetically (since tunable electric coupling has to date remained incompatible with high coherence due to charge and quasiparticle tunneling noise). By using three fluxon tunneling paths, and two islands with controllable charge offsets, one gains the required degrees of freedom to map the X and Y spin operators onto the common and differential mode currents of two DC SQUID loops, while holding all charge offsets fixed.

Thus, a first embodiment of a JPSQ is a qubit comprising a superconductor arranged in a loop. The loop is interrupted by a plurality of tunneling circuits for tunneling magnetic fluxons between the interior and exterior of the loop according to respective tunneling amplitudes. At least one such tunneling amplitude is magnetically tunable. At least one island in a portion of the loop between the tunneling circuits is electrically biasable to adjust relative phases between the tunneling amplitudes.

In some embodiments, at least two of the plurality of tunneling circuits each comprise a direct current superconducting quantum interference device (DC SQUID).

In some embodiments, each such DC SQUID comprises a superconductor arranged in a second loop that is interrupted by two Josephson junctions, the DC SQUID being magnetically tunable by varying a magnetic flux passing through the second loop.

In some embodiments, an island in the loop between two of the DC SQUIDs is electrically biased with an excess electrical charge to thereby emulate a zero transverse field.

In some embodiments, the excess electrical charge is approximately that of one electron.

Some embodiments include a coupler for electrically coupling to the island to produce a transverse electric dipole moment.

In some embodiments, the two DC SQUIDs are magnetically biased so that coupling an additional magnetic flux to the two DC SQUIDs in either a differential mode or a common mode emulates coupling to a transverse magnetic moment.

In some embodiments, the plurality of tunneling circuits further comprises a third, non-tunable fluxon tunneling circuit. A second island in the loop is electrically biased with a second excess electrical charge to thereby emulate the zero transverse field.

In some such embodiments, the excess electrical charge and the second excess electrical charge each are approximately two-thirds of one electron.

In some such embodiments, magnetic coupling to the common and differential modes of the two DC SQUID fluxes produces two orthogonal transverse magnetic dipole moments.

In some such embodiments, electrical coupling to the common and differential modes of the two island charges produces two orthogonal transverse electric dipole moments.

Another embodiment of the concepts and techniques disclosed herein is a method of operating a qubit. The qubit includes a superconductor arranged in a loop that is interrupted by a plurality of tunneling circuits for tunneling magnetic fluxons between the interior and exterior of the loop according to respective tunneling amplitudes. The method includes electrically biasing an island in a portion of the loop between two of the tunneling circuits to adjust relative phases between the tunneling amplitudes of the two tunneling circuits. The method also includes magnetically tuning either or both of the two tunneling circuits.

In some embodiments, the two tunneling circuits each comprise a direct current superconducting quantum interference device (DC SQUID).

In some embodiments, magnetically tuning either DC SQUID comprises varying a magnetic flux passing through a superconducting loop of the DC SQUID.

In some embodiments, electrically biasing includes biasing with an excess electrical charge to thereby emulate a zero transverse field.

In some embodiments, the excess electrical charge is approximately that of one electron.

Some embodiments include electrically coupling to the island to produce a transverse electric dipole moment.

Some embodiments include magnetically biasing the two DC SQUIDs so that coupling an additional magnetic flux to the two DC SQUIDs in either a differential mode or a common mode emulates coupling to a transverse magnetic moment.

In some embodiments, the plurality of tunneling circuits further comprises a third, non-tunable fluxon tunneling circuit, and the method further includes electrically biasing a second island in the loop with a second excess electrical charge to thereby emulate the zero transverse field.

In some embodiments, the excess electrical charge and the second excess electrical charge each are approximately two-thirds of one electron.

Some embodiments further include magnetically coupling to common and differential modes of the two DC SQUID fluxes to produce two orthogonal transverse magnetic dipole moments.

Some embodiments further include electrically coupling to common and differential modes of the two island charges to produce two orthogonal transverse electric dipole moments.

It is appreciated that the concepts, structures, and techniques disclosed herein may be applied in other embodiments.

DESCRIPTION OF THE FIGURES

The manner and process of making and using the disclosed embodiments may be appreciated by reference to the drawings, in which.

DETAILED DESCRIPTION OF ILLUSTRATIVE EMBODIMENTS

Figure 2:
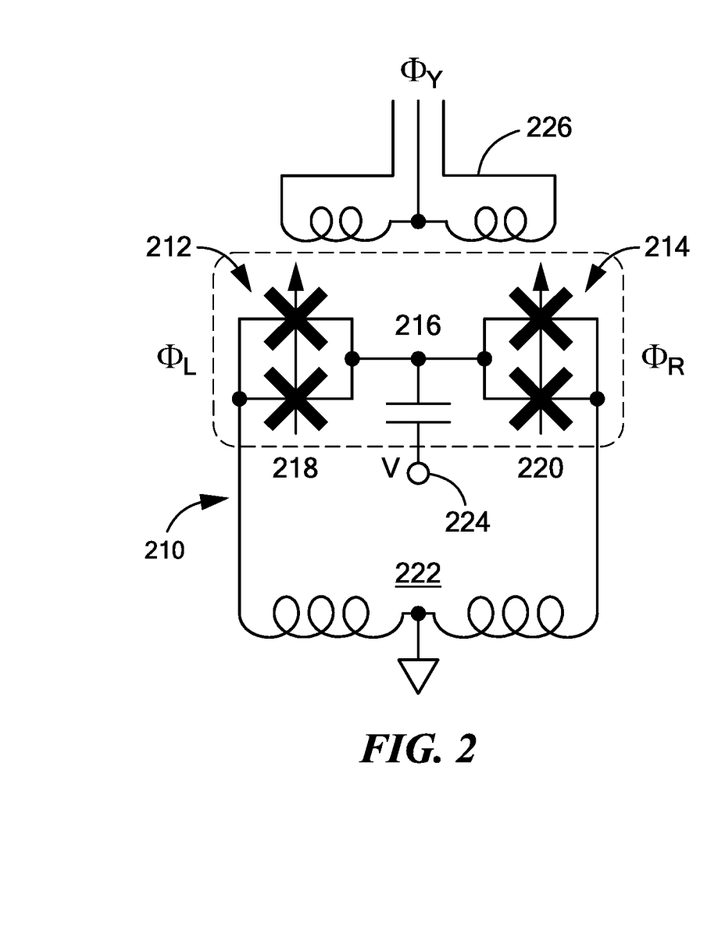
FIGS. 2-2D show a JPSQ for emulating vector spins in an embodiment having one transverse magnetic dipole moment and one transverse electric dipole moment.
Figure 2A:
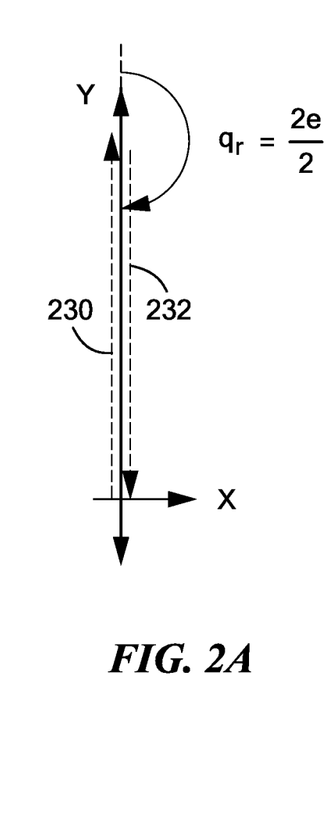
Figure 2B:
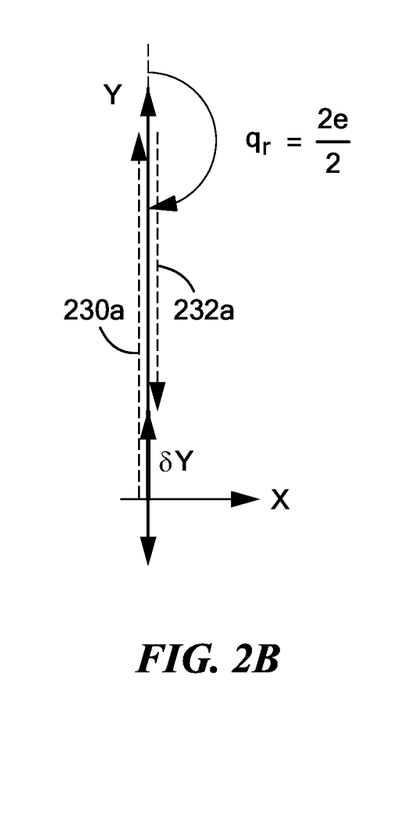
Figure 2C:
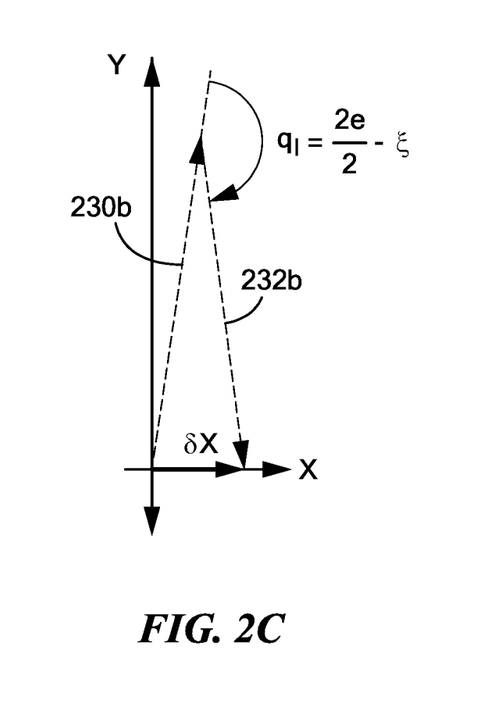

The basic operation of Josephson phase-slip qubits ("JPSQs") is illustrated in FIGS. 2 through 2C. FIG. 2 shows the simplest version of a JPSQ 210, in which the DC SQUID 116 used in FIG. 1A to implement an effective, flux-tunable Josephson energy is replaced by two DC SQUIDs 212 and 214 in series, separated by a central island 216. This configuration results in two parallel fluxon tunneling paths 218 and 220 into or out of the loop 222, each of which is independently flux-tunable. We choose parameters such that each of these paths 218 and 220 individually corresponds to a strong fluxon tunneling amplitude (respectively denoted "230" and "232" in FIGS. 2A-2C). Then, using a voltage applied to a nearby gate electrode 224, the island 216 is biased such that its induced polarization charge is half a Cooper pair. This biasing induces a complete destructive interference between the two (individually strong) fluxon tunneling amplitudes 230 and 232 via the Aharonov-Casher effect, resulting in total suppression of the tunneling, as illustrated by the π radian phase shift in FIG. 2A.

If an external loop 226 (or other qubit) couples with opposite mutual inductance to the two DC SQUIDs 212 and 214, as shown in FIG. 2, then the magnitudes of the two tunneling amplitudes are affected oppositely. This is shown in FIG. 2B, with modified tunneling amplitudes labeled 230a and 230b respectively. The result is a linear increase in the energy splitting with flux around zero, corresponding to a nonzero transverse magnetic moment.

Figure 2D:
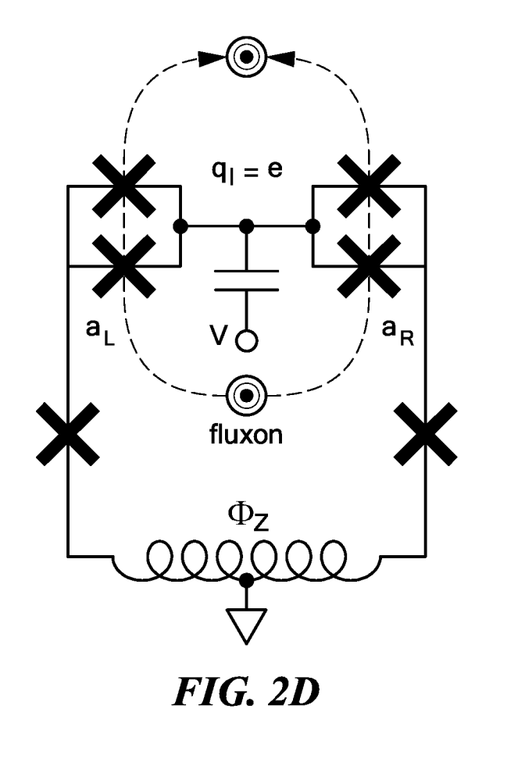

Correspondingly, charge displacements δ away from half a Cooper pair then appear as transverse fields δY in the direction orthogonal to this, as shown in FIG. 2C with the respective tunneling amplitudes labeled 230b and 232b. These circuits can readily be implemented with design parameters consistent with the qubit coherence previously achieved with capacitively-shunted flux qubits. As in FIG. 1D above, FIG. 2D shows the JPSQ from a fluxon perspective. Here, a fluxon stored in the loop of the qubit has two parallel tunneling paths by which it can exit the loop. The closed curve formed by these two paths contains the superconducting island, such that charge on this island causes a phase shift between the paths due to the Aharonov-Casher effect.

Figure 3:
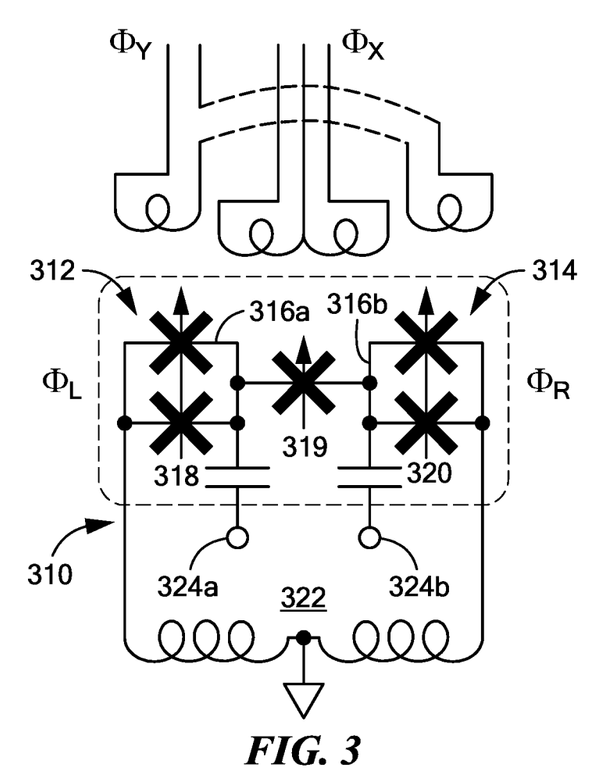
FIGS. 3-3C show a JPSQ for emulating vector spins in an embodiment having two orthogonal transverse magnetic moments.

The JPSQ concept can be extended straightforwardly to a circuit 310 in which both of the two orthogonal transverse moments are magnetic, as shown in FIG. 3. As with the JPSQ shown in FIG. 2, the JPSQ of FIG. 3 has two DC squids 312 and 314 in series, each providing a respective fluxon tunneling path 318, 320 into or out of the loop 322 having a tunable tunneling amplitude. Here, we add one additional fluxon tunneling path 319 with a third Josephson junction, and bias the resulting two islands 316a and 316b with separate voltages using corresponding electrodes 324a and 324b.

Figure 3A:
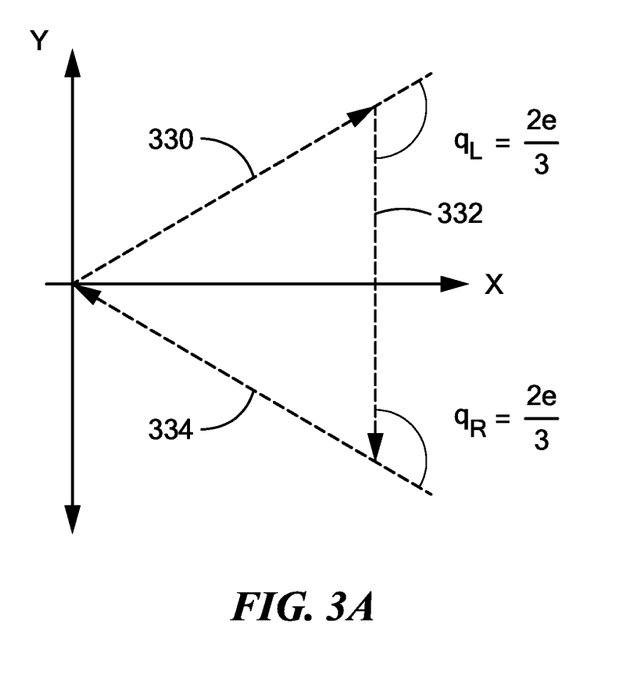

As illustrated in FIG. 3A, if the polarization charges on these two islands 316a and 316b are both set to one third of a Cooper pair, and the three tunneling paths 318, 319, and 320 have the same respective tunneling amplitudes 330, 332, and 334, then a completely destructive Aharonov-Casher interference again occurs due to a 2π/3 radian phase shift. Then, we need only adjust two of the three amplitudes 330, 332, and 334 to control two orthogonal effective transverse fields. This can be accomplished using differential mode (FIG. 3B) and common mode (FIG. 3C) bias fluxes coupled to the two DC SQUID loops 312, 314.

Figure 3B:
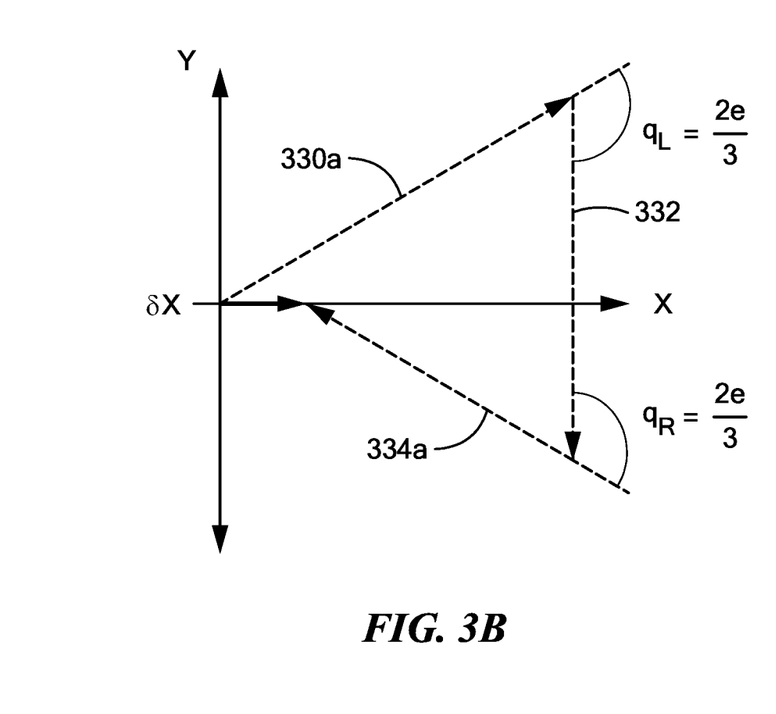
Figure 3C:
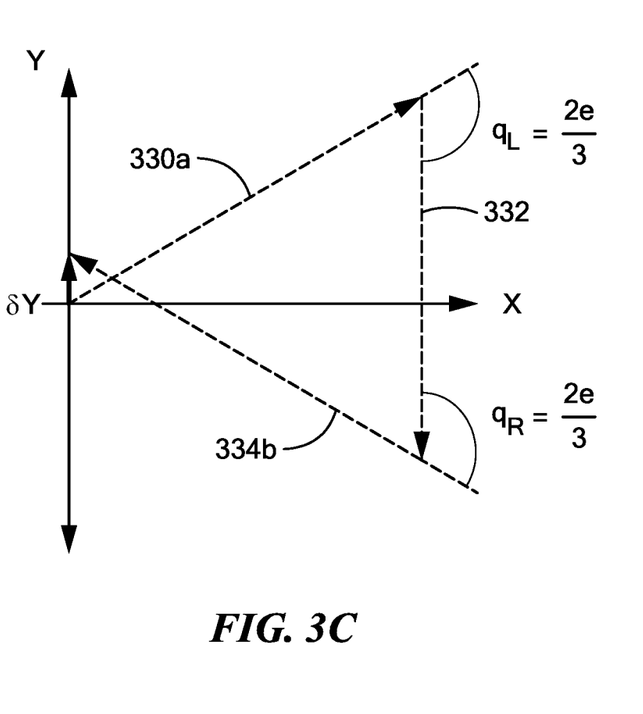

In the differential mode of FIG. 3B, flux changes of equal magnitude but opposite sign are applied to DC SQUIDs 312 and 314, yielding a larger tunneling amplitude 330a and smaller 334a, while the tunneling amplitude 332 remains fixed. Similarly, in the common mode of FIG. 3C, flux changes of equal magnitude and identical sign are applied to DC SQUIDS 312 and 314, increasing both tunneling amplitudes—amplitude 330 increases to the larger amplitude 330a, as before, but amplitude 334 increases (rather than decreases) to produce amplitude 334b.

Figure 4:
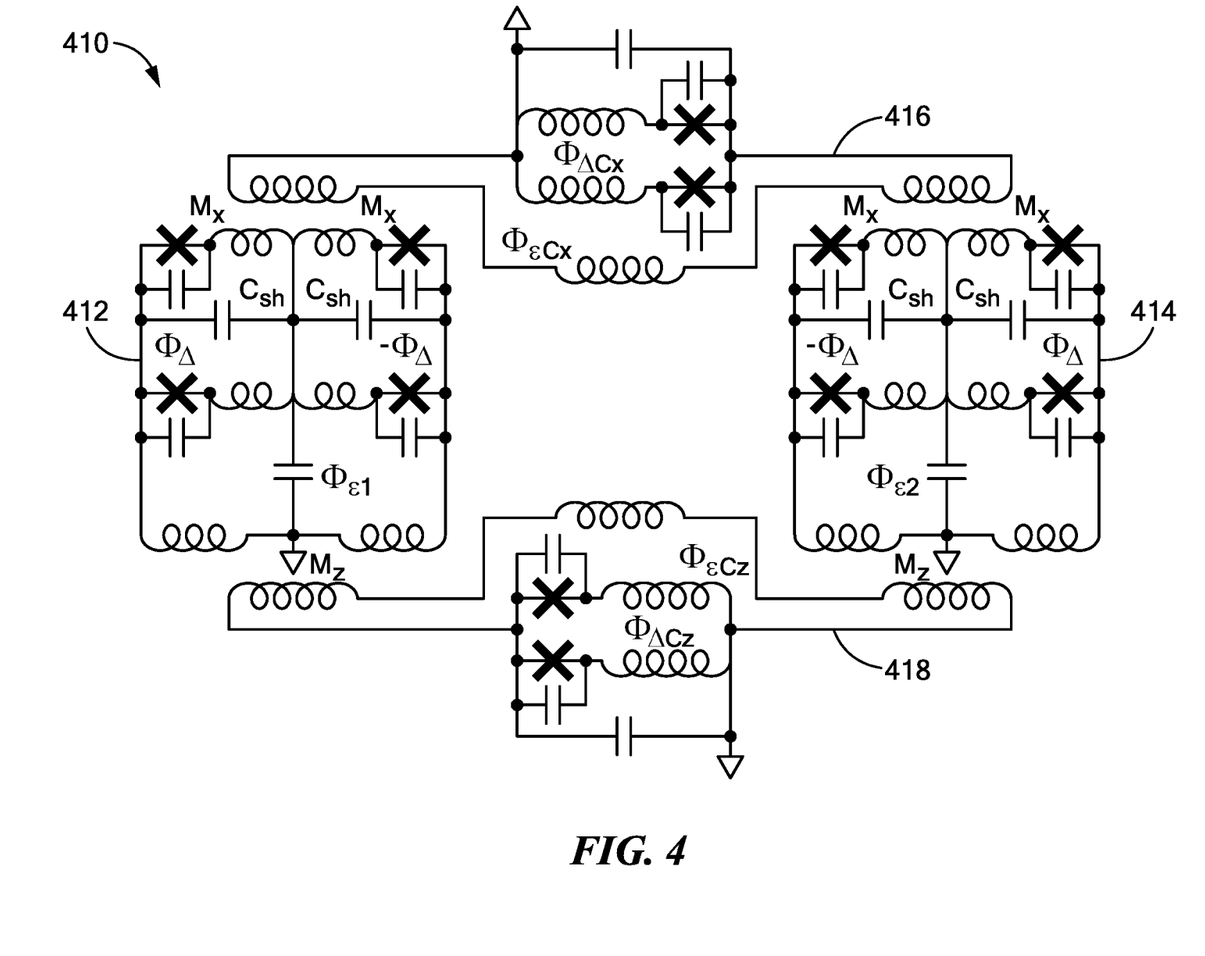
FIG. 4 shows a circuit including two JPSQs according to the embodiment of FIGS. 3-3C, coupled to each other with two RF SQUID couplers, to realize simultaneous and independently-controllable ZZ and XX spin coupling.

FIG. 4 shows an exemplary circuit 410 implementing XX and ZZ coupling between two JPSQs. It consists of two JPSQs 412 and 414 coupled via two parallel RF SQUID couplers 416 and 418. The coupler 416 is used for the transverse (XX) channel, while the coupler 418 is used for the Ising (ZZ) channel. Note here that the XX channel appears in the common mode flux coupling to the two DC SQUIDs of each qubit, since the static offsets $\Phi_A$ have opposite sign for the two SQUIDs, reversing the roles of common and differential modes.

In this context, any charge noise appearing on the islands of the two JPSQs 412 and 414 would in this representation appear as fluctuating Y fields. Given that charge noise tends to be relatively larger compared to flux noise in appropriate units, for our circuit this noise advantageously does not appear in first order in either the X or Z channels when any X or Z fields are present, but only in the second order.

Figure 5:
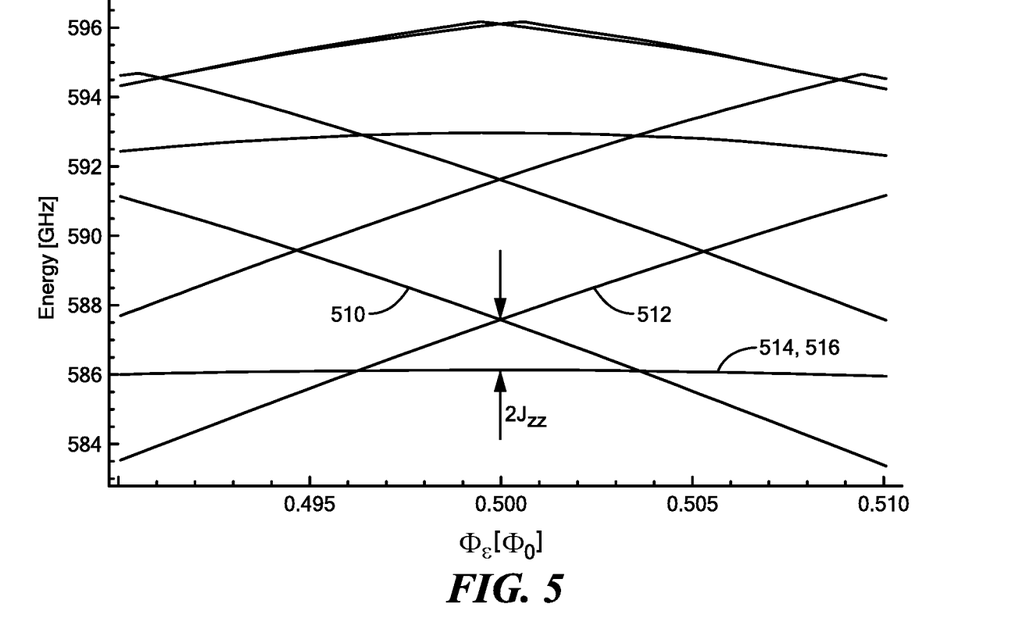
FIGS. 5 and 5A show plots of the first ten energy levels as a function of Z flux for the circuit of FIG. 4.
Figure 5A:
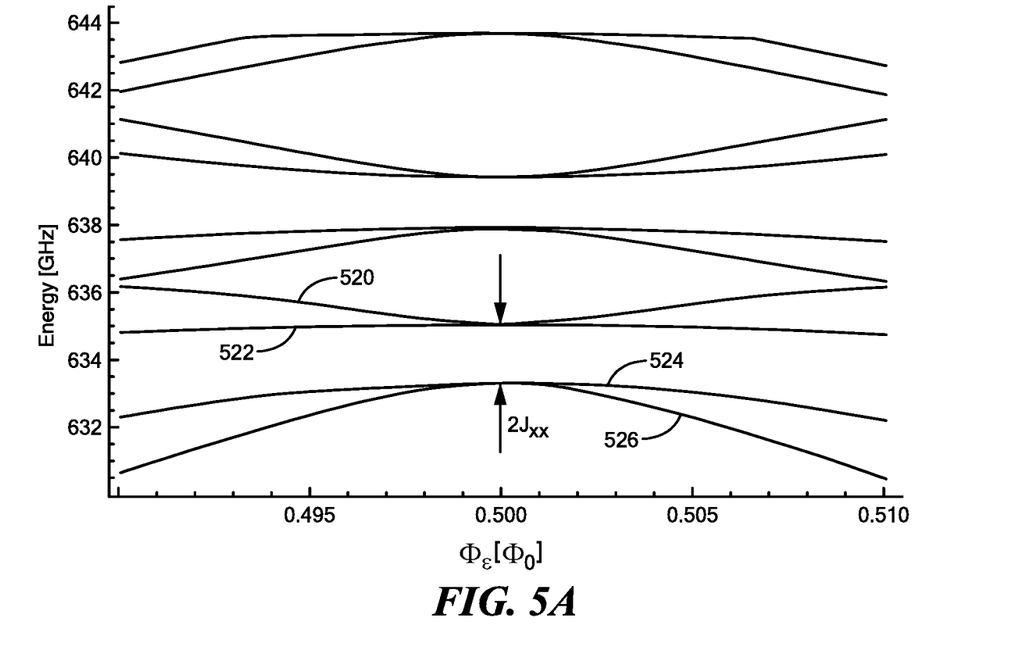

FIGS. 5 and 5A show the results of computationally modeling the quantum energy levels of the circuit of FIG. 4 as a function of the Z field applied to both JPSQs. For the lowest four levels, corresponding to the computational states of two spins, the calculated dependence on flux is exactly as expected for XX and ZZ coupling. FIG. 5 shows the results when only the ZZ coupler 418 is turned on, producing the expected energy shift between the two states 510 and 512 with aligned spins and the two 514 and 516 with anti-aligned spins. The results of FIG. 5A were calculated with only the XX coupler 416 turned on, such that for zero Z field ($\Phi_\varepsilon$=0.5) the eigenstates 520, 522, 524, and 526 are reoriented into two pairs either aligned (520, 522) or anti-aligned (524, 526) along X. These plots were calculated with JPSQ parameters compatible with achieving high coherence, comparable to previous high-coherence flux qubit results. The sign of the XX and ZZ interactions (ferromagnetic or antiferromagnetic) realized in this way can be controlled with the same techniques used for conventional flux qubits.

The circuits described herein may be combined with the methods for implementing multi-spin interactions in my U.S. application Ser. No. 15/976,291 (the '291 Application), filed May 10, 2018 and entitled "Four Spin Couplers for Quantum Information Processing." These circuits may be cooperatively combined with the methods for implementing complex spin connectivity in my U.S. application Ser. No. 15/354,286 (the '286 Application), filed Nov. 17, 2016 and entitled "Paramagnetic Tree Coupling of Spin Qubits." These combinations advantageously open the door for critical capabilities across a wide range of quantum information applications and uses. One such use is static quantum error suppression using stabilizer and subsystem codes, for example in my U.S. application Ser. No. 16/276,100 (the '100 Application), filed Feb. 14, 2019 and entitled "Physical-Layer Quantum Error Suppression for Superconducting Qubits." Another such use is multi-spin, non-stoquastic quantum fluctuations for quantum annealing Hamiltonians, one of the most promising methods of increasing the "quantumness" in QA systems. Yet another use is for Hamiltonian quantum computing and gate-model quantum computing. Still another use is in providing tailored driver Hamiltonians for constrained quantum optimization. A further use is enabling multiqubit interactions required for Hamiltonian and holonomic quantum computing. An additional use is quantum simulation of chemistry and molecular energies. Still a further use is providing engineered Hamiltonians for quantum machine learning. A person skilled in the art may appreciate other uses and applications of these concepts and techniques.

Figure 6:
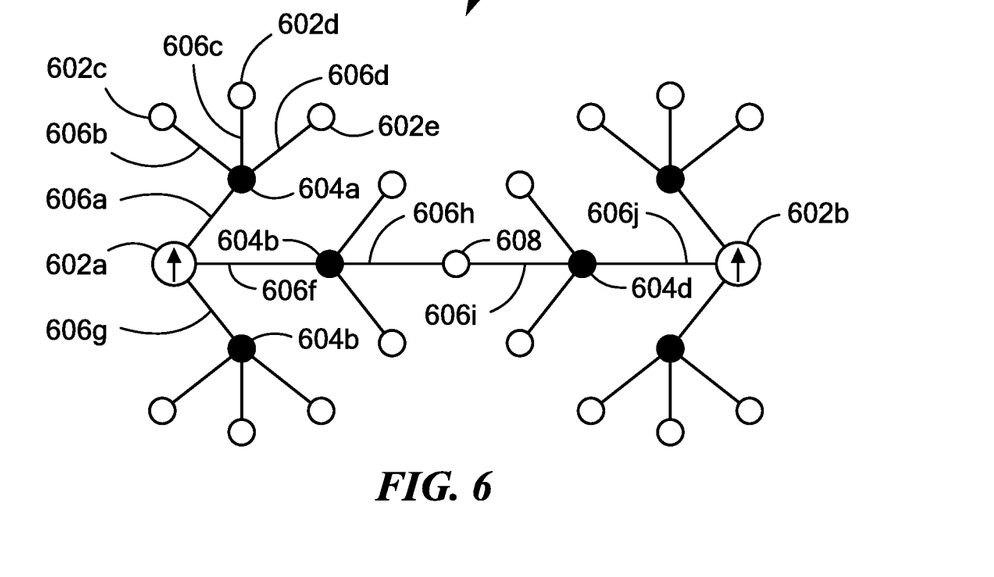
FIGS. 6 to 6B show how JPSQs can be used to implement quantum error suppression in a paramagnetic tree structure for coupling two qubits together.
Figure 6A:
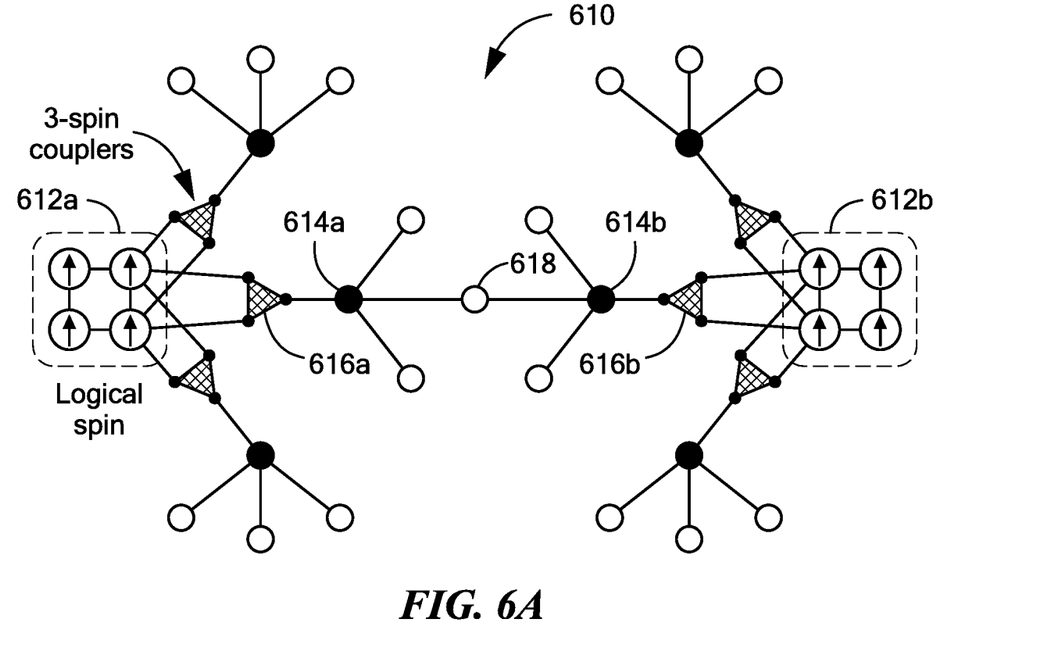
Figure 6B:
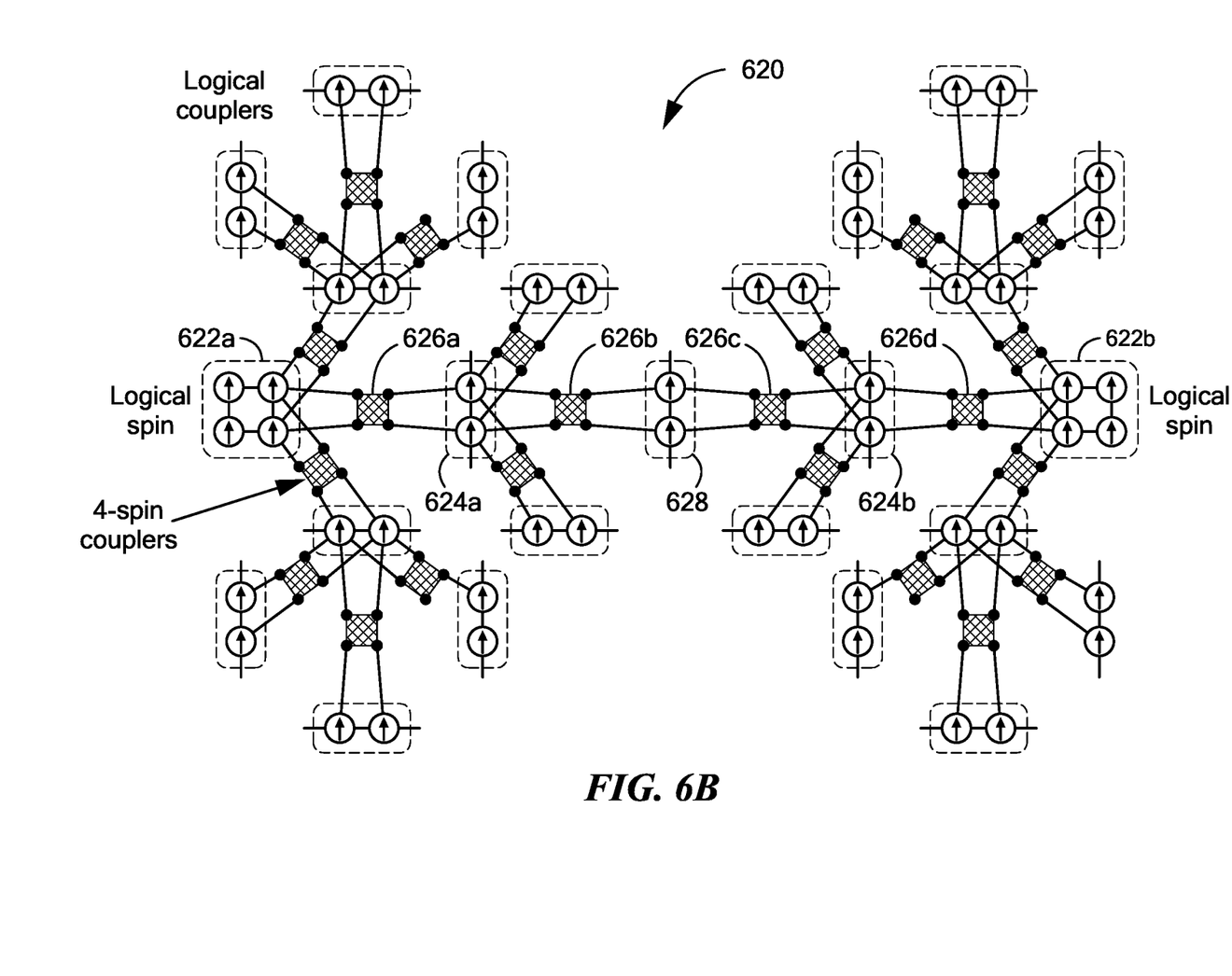

In accordance with one of these example applications, FIGS. 6-6B show paramagnetic tree structures for coupling two logical qubits together according to three different coupling mechanisms. FIG. 6 shows a paramagnetic tree structure 600 for a physical-physical-physical quantum spin state coupling between two physical qubits 602a, 602b. FIG. 6A shows a paramagnetic tree structure 610 for a logical-physical-logical quantum spin state coupling between two logical qubits 612a, 612b. And FIG. 6B shows a paramagnetic tree structure 620 for a logical-logical-logical quantum spin state coupling between two logical qubits 622a, 622b.

General implementation details for such trees may be found, for example, in the above-referenced '286 Application. The concepts, structures, and techniques described herein improve on such trees, as now described.

FIGS. 6 to 6B show an example of how JPSQs can be used to engineer quantum error suppression in a paramagnetic tree structure. FIG. 6 shows a piece of a bare paramagnetic tree 600 having two physical qubits (indicated by arrows inside filled circles) 602a and 602b as leaf nodes, which is like FIGS. 1 and 3 in the above-mentioned '286 Application. In the graph of FIG. 6, edges indicate physical inductive couplings and solid filled circles indicate coupler qubits, as described below. Physical qubit 602a is coupled to a branch point 604a via a 2-spin inductive coupling 606a. Two-spin inductive couplings, such as circuit 606a, couple the quantum states of two spins in various possible ways, such as XX, YY, ZZ, or a controllable combination of these (for example, the circuit 606a may be an "angle coupler," "transfer coupler," "sign coupler," or any combination of these as those terms are used in the '286 Application). The branch point 604a is coupled to three leaf nodes 602c, 602d, and 602e via 2-spin inductive couplings 606b, 606c, and 606d. Similarly, the physical qubit 602a is coupled to a branch point 604b via a 2-spin inductive coupling 606f, and to a branch point 604c via a 2-spin inductive coupling 606g.

It is appreciated that in some embodiments of the concepts described herein, the three leaf nodes 606c-606e may in fact not be leaves at all. In some embodiments they may be additional physical inductive couplings to allow additional quantum operators to work on the quantum state of the physical qubit 602a. Or, they may be branch points to increase the branching capabilities of the paramagnetic tree structure 600. A person having ordinary skill in the art may appreciate other uses for such tree nodes using the concepts described herein. It is also appreciated that in various embodiments, a physical qubit may be coupled to more or fewer than three other branch points, so FIG. 6 is merely exemplary of the disclosed techniques.

Branch point 604b is coupled to a boundary coupler 608. The boundary coupler 608 provides a mechanism for the physical spins of physical qubits 602a and 602b to become entangled. The boundary coupler 608 is coupled to a branch point 604d via another 2-spin inductive coupling 606i, and the branch point 604d is coupled to the physical qubit 602b via a 2-spin inductive coupling 606j. Other nodes, branch points, qubits, and couplings are not labeled for clarity.

In accordance with the paramagnetic tree structure of FIG. 6, couplings between two physical qubits 602a and 602b are controlled uniquely via boundary coupler 608. Notably, the coupling is created using 2-spin (i.e., physical-to-physical) couplers, so the paramagnetic tree structure 600 enables an increased hardware connectivity between physical quantum states.

As a first improvement, FIG. 6A illustrates a paramagnetic tree structure 610 for coupling two logical qubits 612a and 612b based on JPSQs (as illustrated in FIGS. 2, 3, and 4), which incorporate quantum error suppression using physical spin couplings as described in the '100 Application. The shaded squares containing four JPSQs are distance-2 logical spins.

The logical quantum spin of logical qubit 612a is coupled to a branch point 614a, just like the coupling of the physical quantum spin of qubit 602a to branch point 604b of FIG. 6. However, in FIG. 6A the logical quantum spin operator corresponds to a two-physical-qubit operator in the logical qubit 612a, and therefore must be translated into a physical spin operator via a 3-spin coupler 616a for coupling into the paramagnetic tree structure 610.

The remainder of the coupling of the spin according to FIG. 6A should be clear. The branch point 614a is coupled to a boundary coupler 618, which results in a coupling between logical qubits 612a and 612b. The boundary coupler 618 is coupled to a 3-spin coupler 616b, which itself translates the physical spin operator of the paramagnetic tree structure 610 to the logical quantum spin operator of the logical qubit 612b. Additional paths connecting in this fashion to other logical qubits according to the tree structure 610 are indicated in FIG. 6A, but not labeled for clarity.

FIG. 6B illustrates a second improvement on the paramagnetic tree using the JPSQ concepts described herein to provide a structure 620 for two logical qubits 622a and 622b using purely logical spin couplings. Crucially, and advantageously over the prior art, the paramagnetic tree structure 620 conveys and entangles quantum spin states using only logical operators. Two physical qubits are needed at each coupling to propagate a logical spin state, rather than a physical spin, necessitating the use of 4-spin couplers (e.g. as described in the above-referenced '291 Application).

Thus, in FIG. 6B the logical qubit 622a provides a logical quantum spin that is coupled to a branch point 624a. Two of the physical qubits making up the logical qubit 622a are coupled to the two physical qubits in the branch point 624a using a 4-spin coupler 626a. The branch point 624a propagates the logical quantum spin state via another 4-spin coupler 626b to a boundary coupler 628. The boundary coupler 628 is shown as having two physical qubits, again to maintain the logical quantum spin state. The boundary coupler 628 is coupled to a branch point 624b via another 4-spin coupler 626c, and a final 4-spin coupler 626d couples two physical qubits in the branch point 624b to two physical qubits in the logical qubit 622b.

In this way, the quantum spin state remains encoded throughout the paramagnetic tree structure 620. As these logical spin states are therefore protected by passive quantum error suppression, throughout the paramagnetic tree structure 620, decoherence can be greatly reduced.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, inventive aspects may lie in less than all features of each disclosed embodiment.

Having described implementations which serve to illustrate various concepts, structures, and techniques which are the subject of this disclosure, it will now become apparent to those of ordinary skill in the art that other implementations incorporating these concepts, structures, and techniques may be used. Accordingly, it is submitted that that scope of the patent should not be limited to the described implementations but rather should be limited only by the spirit and scope of the following claims.

What is claimed is:

1. A qubit comprising a superconductor arranged in a loop that is interrupted by a plurality of tunneling circuits for tunneling magnetic fluxons between the interior and exterior of the loop according to respective tunneling amplitudes, at least one such tunneling amplitude being magnetically tunable, and at least one island in a portion of the loop between the tunneling circuits being electrically biasable to adjust relative phases between the tunneling amplitudes.

2. The qubit according to claim 1, wherein at least two of the plurality of tunneling circuits each comprise a direct current superconducting quantum interference device (DC SQUID).

3. The qubit according to claim 2, wherein each such DC SQUID comprises a superconductor arranged in a second loop that is interrupted by two Josephson junctions, the DC SQUID being magnetically tunable by varying a magnetic flux passing through the second loop.

4. The qubit according to claim 2, wherein an island in the loop between two of the DC SQUIDs is electrically biased with an excess electrical charge to thereby emulate a zero transverse field.

5. The qubit according to claim 4, wherein the excess electrical charge is approximately that of one electron.

6. The qubit according to claim 4, further comprising a coupler for electrically coupling to the island to produce a transverse electric dipole moment.

7. The qubit according to claim 4, wherein the two DC SQUIDs are magnetically biased so that coupling an additional magnetic flux to the two DC SQUIDs in either a differential mode or a common mode emulates coupling to a transverse magnetic moment.

8. The qubit according to claim 4, wherein the plurality of tunneling circuits further comprises a third, non-tunable fluxon tunneling circuit, and wherein a second island in the loop is electrically biased with a second excess electrical charge to thereby emulate the zero transverse field.

9. The qubit according to claim 8, wherein the excess electrical charge and the second excess electrical charge each are approximately two-thirds of one electron.

10. The qubit according to claim 8, wherein magnetic coupling to the common and differential modes of the two DC SQUID fluxes produces two orthogonal transverse magnetic dipole moments.

11. The qubit according to claim 8, wherein electrical coupling to the common and differential modes of the two island charges produces two orthogonal transverse electric dipole moments.

12. A method of operating a qubit comprising a superconductor arranged in a loop that is interrupted by a plurality of tunneling circuits for tunneling magnetic fluxons between the interior and exterior of the loop according to respective tunneling amplitudes, the method comprising:

electrically biasing an island in a portion of the loop between two of the tunneling circuits to adjust relative phases between the tunneling amplitudes of the two tunneling circuits; and
magnetically tuning either or both of the two tunneling circuits.

13. The method according to claim 12, wherein the two tunneling circuits each comprise a direct current superconducting quantum interference device (DC SQUID).

14. The method according to claim 13, wherein magnetically tuning either DC SQUID comprises varying a magnetic flux passing through a superconducting loop of the DC SQUID.

15. The method according to claim 13, wherein electrically biasing includes biasing with an excess electrical charge to thereby emulate a zero transverse field.

16. The method according to claim 15, wherein the excess electrical charge is approximately that of one electron.

17. The method according to claim 15, further comprising electrically coupling to the island to produce a transverse electric dipole moment.

18. The method according to claim 15, further comprising magnetically biasing the two DC SQUIDs so that coupling an additional magnetic flux to the two DC SQUIDs in either a differential mode or a common mode emulates coupling to a transverse magnetic moment.

19. The method according to claim 15, wherein the plurality of tunneling circuits further comprises a third, non-tunable fluxon tunneling circuit, the method further comprising electrically biasing a second island in the loop with a second excess electrical charge to thereby emulate the zero transverse field.

20. The method according to claim 19, wherein the excess electrical charge and the second excess electrical charge each are approximately two-thirds of one electron.

21. The method according to claim 19, further comprising magnetically coupling to common and differential modes of the two DC SQUID fluxes to produce two orthogonal transverse magnetic dipole moments.

22. The method according to claim 19, further comprising electrically coupling to common and differential modes of the two island charges to produce two orthogonal transverse electric dipole moments.

* * * * *